(12) United States Patent
Liao et al.

(10) Patent No.: US 7,560,338 B2
(45) Date of Patent: Jul. 14, 2009

(54) MANUFACTURING METHOD OF NON-VOLATILE MEMORY

(75) Inventors: Hsiu-Han Liao, Hsinchu (TW); Chi-Hung Chao, Hsinchu (TW); Ching-Yu Chen, Hsinchu (TW)

(73) Assignee: Winbond Electronics Corp., Taichung County (TW)

( * ) Notice: Subject to any disclaimer, the term of this patent is extended or adjusted under 35 U.S.C. 154(b) by 276 days.

(21) Appl. No.: 11/747,230

(22) Filed: May 11, 2007

(65) Prior Publication Data

US 2007/0207556 A1    Sep. 6, 2007

Related U.S. Application Data

(62) Division of application No. 11/161,618, filed on Aug. 10, 2005, now abandoned.

(30) Foreign Application Priority Data

Mar. 25, 2005   (TW) ............................ 94109247 A

(51) Int. Cl.
H01L 21/00    (2006.01)
(52) U.S. Cl. .............................. 438/257; 257/E21.423

(58) Field of Classification Search ................. 438/257; 257/E29.309, E21.179, E21.21, E21.18, E21.423
See application file for complete search history.

(56) References Cited

U.S. PATENT DOCUMENTS

| 2003/0032243 A1* | 2/2003 | Ogura et al. | 438/257 |
| 2006/0033138 A1* | 2/2006 | Fukada | 257/296 |
| 2006/0175652 A1* | 8/2006 | Yang et al. | 257/314 |
| 2007/0108503 A1* | 5/2007 | Chen et al. | 257/316 |

* cited by examiner

Primary Examiner—Thao P. Le
(74) Attorney, Agent, or Firm—Jianq Chyun IP Office

(57) ABSTRACT

A nonvolatile memory consisting of a substrate, a dielectric layer, word lines, word gates, conductive spacers, electron trapping layer, insulation layer and buried bit lines is provided. The dielectric layer is on the substrate and has several poly trenches thereon, and the word lines are disposed over the substrate across the poly trenches. The word gates are in the poly trenches between the word lines and the substrate, and the conductive spacers are between the word gates and the inner wall of each poly trench. The electron trapping layer is disposed between the conductive spacers and the inner wall of each poly trench and between the conductive spacers and the substrate. The insulation layer is between the conductive spacers and the word gates. The buried bit lines are in the substrate between the poly trenches.

10 Claims, 9 Drawing Sheets

MANUFACTURING METHOD OF NON-VOLATILE MEMORY

CROSS-REFERENCE TO RELATED APPLICATION

This application is a divisional of a prior application Ser. No. 11/161,618, filed Aug. 10, 2005, which claims the priority benefit of Taiwan application serial no. 94109247, filed Mar. 25, 2005, now pending. The entirety of the above-mentioned patent application is hereby incorporated by reference herein and made a part of this specification.

BACKGROUND OF THE INVENTION

1. Field of the Invention

The present invention relates to a semi-conductive memory and the manufacturing method of the same, more specifically, to a non-volatile memory and its manufacturing method.

2. Description of the Related Art

Since the non-volatile memory can store data without constant power supply, therefore nowadays it is a very remarkable memory. As the memory components are made smaller and smaller, a flash memory as shown in FIG. 1 has been developed recently.

With reference to FIG. 1, the flash memory comprises a substrate 100, word gates 110, word lines 120, buried bit lines 130, poly-silicon spacers 140 and oxide/nitride/oxide (ONO) layers (not shown). FIG. 2A to FIG. 2E illustrates a sectional view of the manufacturing flow along the II-II line section of the flash memory in FIG. 1.

With reference to FIG. 2A, first a plurality of poly-silicon layers 102 is formed on the substrate 100. These poly-silicon layers 102 will later be patterned into word gates 110 in FIG. 1.

Next, with reference to FIG. 2B, an ONO layer 104 is formed to cover the substrate 100 and the poly-silicon layer 102. Next, the ONO layer 104 is fully covered by another poly-silicon layer 106.

Next, with reference to FIG. 2C, the poly-silicon layer 106 is etched back, so that a plurality of silicon spacers 140 is formed on the sidewalls of poly-silicon layer 102. Then an ion implantation process 108 is performed upon the substrate 100, so that a lightly doped drain (LDD) area 112 is formed in the substrate 100.

Next, with reference to FIG. 2D, an oxide spacer 114 is formed on the surface of the poly-silicon spacers 140; then another ion implantation process 116 is performed upon the substrate 100, so that a doped area serving as buried bit lines 130 is formed in the substrate 100.

Next, with reference to FIG. 2E, fill the dielectric layer 118 into the spaces between the poly-silicon layers 102, then a plurality of word lines 120 interlacing with the buried bit lines 130 are formed over the substrate 100. Wherein, the word lines 120 are formed by forming a full poly-silicon layer over the substrate 100 first, then pattern the poly-silicon layer to form word lines; and after the word lines 120 are formed, keep etching the poly-silicon layer 102 underneath so as to form blocks of word gates 110.

However, since the poly-silicon layers 102 on the substrate 100 which are near the corner of the ONO layer 104 is hard to be removed, there are usually poly-silicon residues 150 remained along the edges of the ONO layer 104, as shown in FIG. 1 and FIG. 3 (i.e. the sectional view of the line section III-III of FIG. 1). This results in the connection between two word lines and memory failure.

SUMMARY OF THE INVENTION

The object of the present invention is to provide a non-volatile memory to prevent memory failures, thus to improve the memory reliability.

Yet another object of the present invention is to provide a manufacturing process of non-volatile memory to avoid the contact between the word lines caused by the electrical-conductive residues.

The present invention provides a non-volatile memory comprising a substrate, a dielectric layer, word lines, word gates, conductive spacers, electron trapping layer, insulation layer and buried bit lines. The dielectric layer is on the substrate and has several poly-silicon trenches thereon, and the word lines are disposed over the substrate across the poly-silicon trenches. The word gates are in the poly trenches between the word lines and the substrate, and the conductive spacers are between the word gates and the inner wall of each poly-silicon trench. The electron trapping layer is between the conductive spacers and the inner wall of each poly-silicon trench and between the conductive spacers and the substrate. The insulation layer is between the conductive spacers and the word gates. The buried bit lines are in the substrate between the poly-silicon trenches.

The present invention further provides a manufacturing process of the non-volatile memory, which comprising providing a substrate first. A plurality of dummy bit lines are formed on the substrate, and then an electron trapping layer is formed covering the substrate and the dummy bit lines. Next, a plurality of conductive spacers is formed on the sidewalls of the dummy bit lines, and then a protection layer is formed on the surface of the conductive spacers. Thereafter, the electron trapping layer uncovered by the conductive spacers is removed, and the conductive layer is then formed between the dummy bit lines. Afterwards, the dummy bit lines is removed to form a plurality of strip structures, and a BL ion implantation process is performed on the substrate, so that the buried bit lines are formed in the substrate. Further next, the buried bit lines are covered with a dielectric layer and let the top of the strip structure is exposed. After that, a plurality of word lines interlacing with the buried bit lines is formed over the substrate, and the conductive layer of the strip structure is then etched by utilizing the word lines as a mask so as to form a plurality of word gates.

Since the present invention adopts dummy bit lines, thus the conductive spacers are formed prior to the formation of the word gates. Therefore, the possibility of remaining residues will be reduced significantly in the step of patternization of forming the word gates, and hence the memory reliability is improved.

The above-mentioned and other purposes, features, and strengths of the present invention will be better understood from the following detailed description of the preferred embodiments of the invention that is provided in communication with the accompanying drawings.

DESCRIPTION OF SOME EMBODIMENTS

The embodiment of the present invention will be described below in conjunction with accompanying drawings. The same or similar reference numbers in drawings and descriptions refer to the same or similar parts. And please be noted that the drawings here are simplified form instead of drawing with accurate scale.

FIG. 4A to FIG. 4H illustrate sectional views of the manufacturing flow process of the non-volatile memory according to an embodiment of the present invention.

Figure 1:
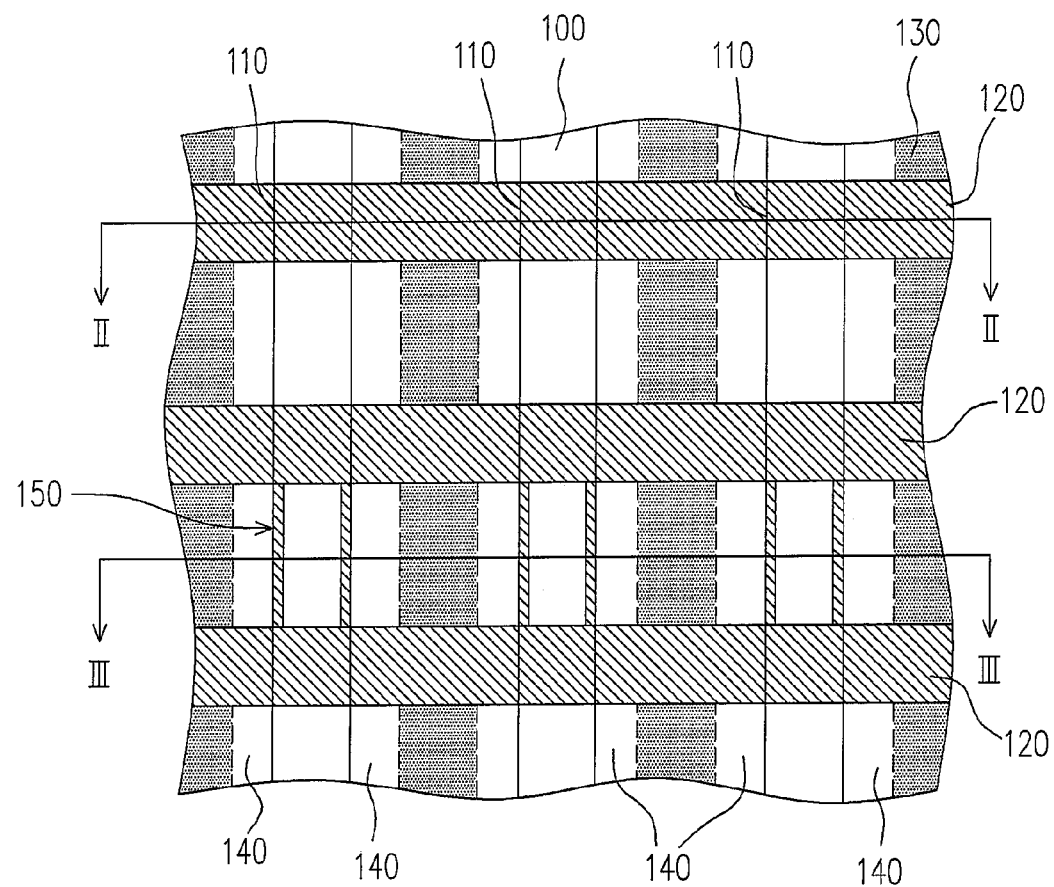
FIG. 1 illustrates a top view of a traditional flash memory.
Figure 2A:
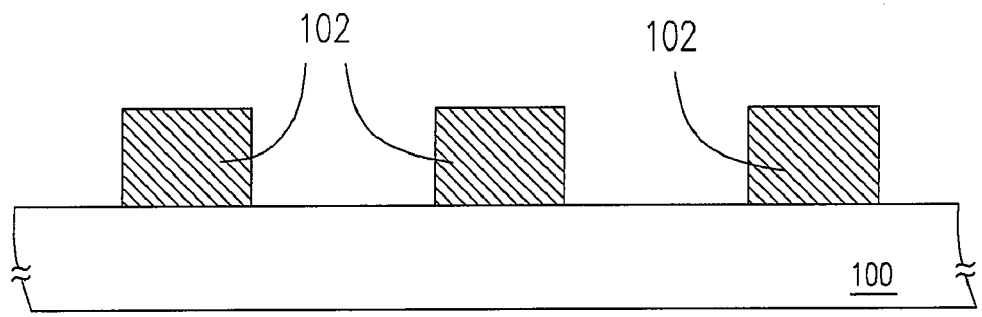
FIG. 2A to FIG. 2E illustrate sectional views of the manufacturing flow along the II-II line section of the flash memory in FIG. 1.
Figure 2B:
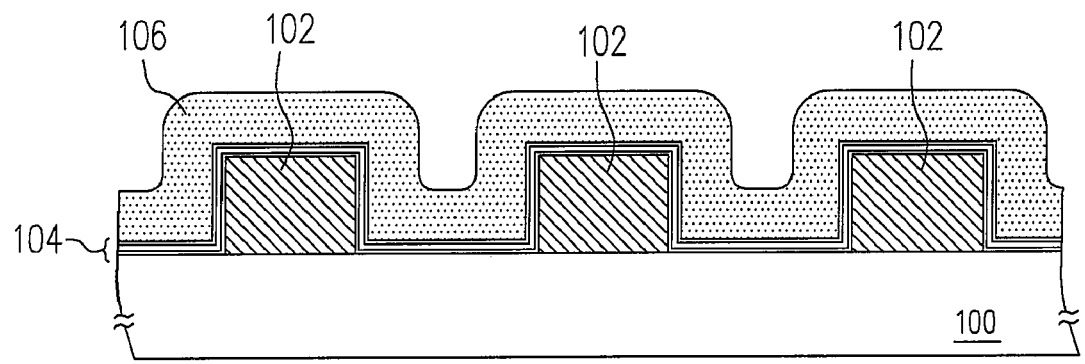
Figure 2C:
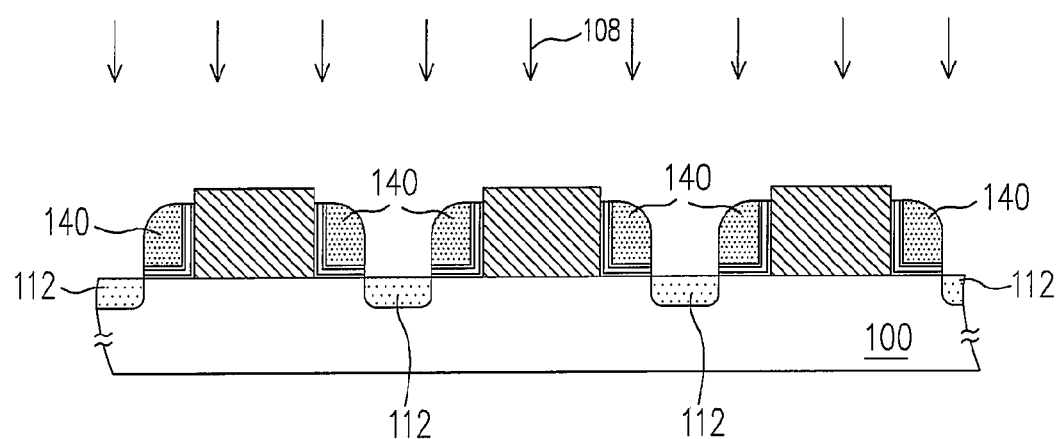
Figure 2D:
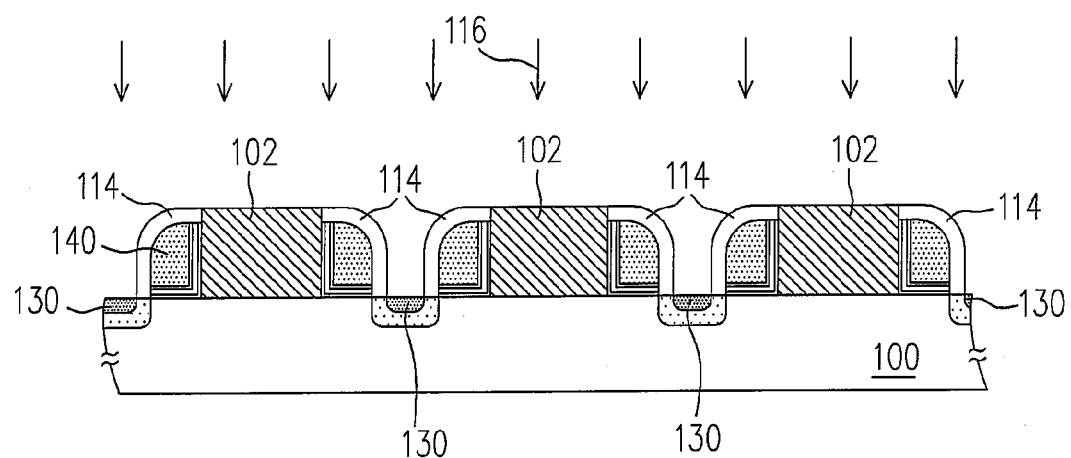
Figure 2E:
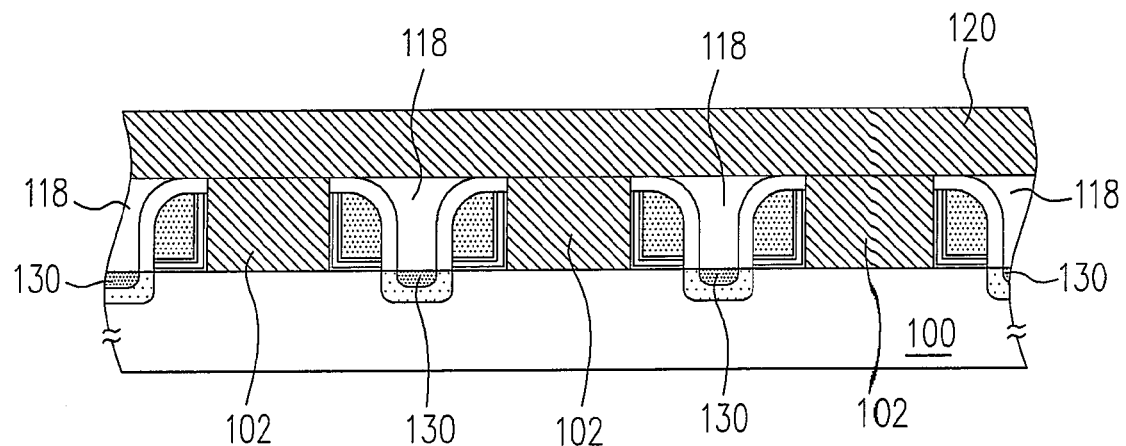
Figure 3:
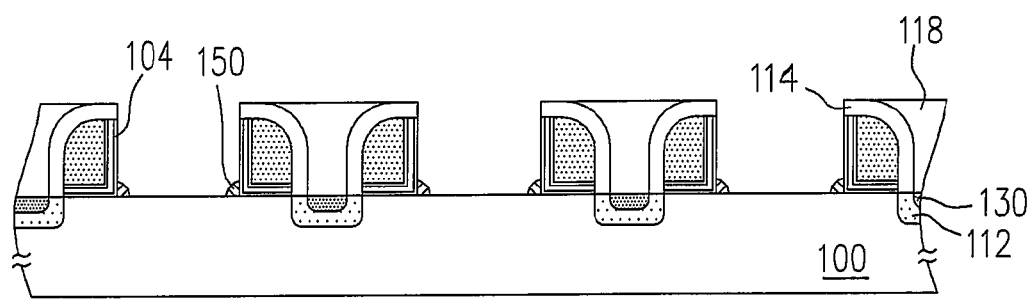
FIG. 3 illustrates a sectional view along the line section III-III in FIG. 1
Figure 4A:
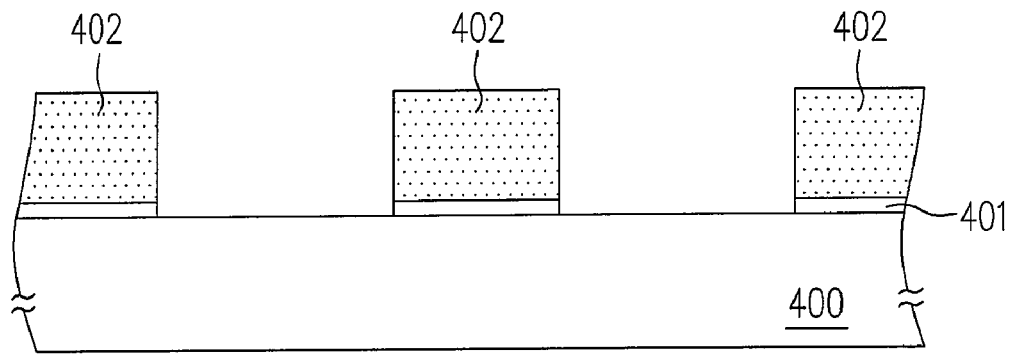
FIG. 4A to FIG. 4H illustrate sectional views of the manufacturing flow process of the non-volatile memory according to an embodiment of the present invention.

With reference to FIG. 4A, a substrate 400 is provided, and a plurality of dummy bit lines 402 is formed on the substrate 400. For example, a thin oxide layer 401 is formed on the substrate 400 first, then a silicon nitride layer is deposited, and then pattern the silicon nitride layer to form the dummy bit lines 402. Besides, instead of being limited by the description of the present embodiment, the dummy bit lines 402 can be other suitable material.

Figure 4B:
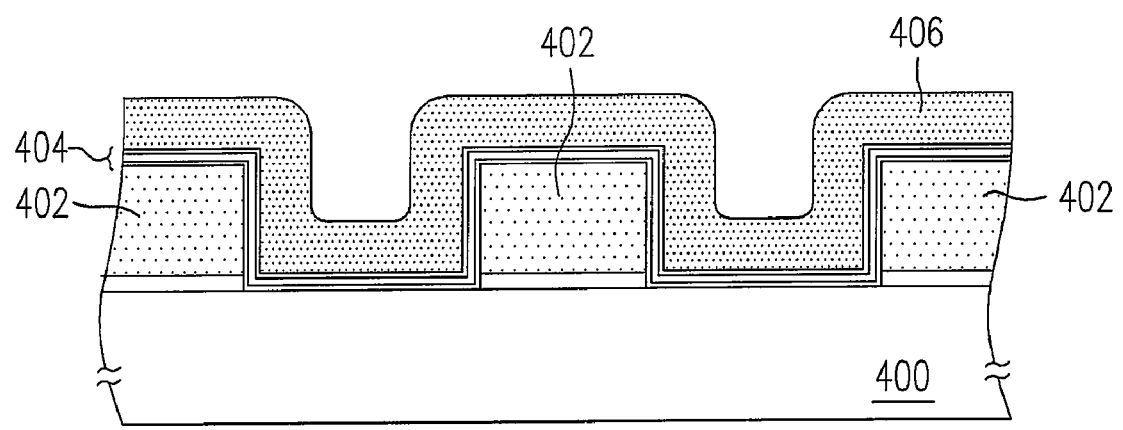

Next, with reference to FIG. 4B, an electron trapping layer 404 is formed to cover the substrate 400 and the dummy bit lines 402, wherein the electron trapping layer 404 for example is a ONO layer or other suitable material. Next, in order to form conductive spacers on the sidewalls of dummy bit lines 402, a poly-silicon layer 406 can be formed on the substrate first to cover the dummy bit lines 402 completely.

Figure 4C:
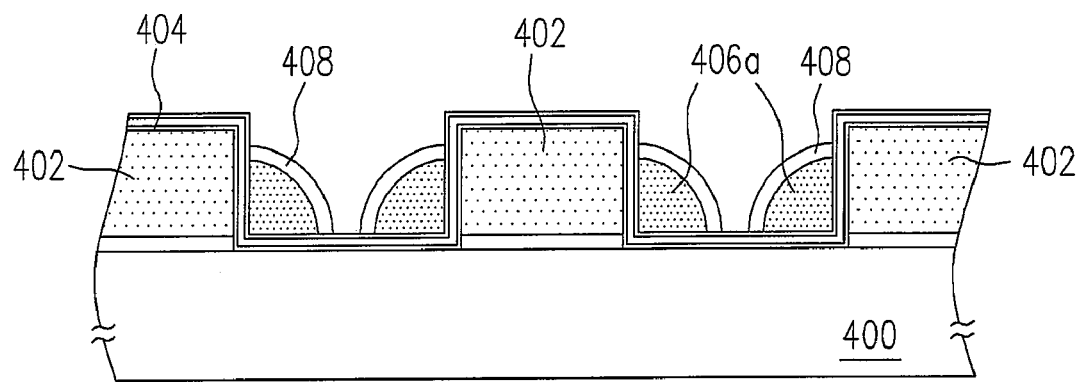

Next, with reference to FIG. 4C, the above described poly-silicon layer 406 is etched back to expose the electron trapping layer 404 of the dummy bit lines 402. Meanwhile, conductive spacers 406a are formed on the sidewalls of the dummy bit lines 402. Next, a protection layer 408 is formed on the conductive spacers 406a so as to protect the conductive spacers 406a throughout the later manufacturing process. The method of forming the protection layer 408, for example, includes forming a thermal oxide layer on the surface of the conductive spacers 406a using a thermal oxidation method.

Figure 4D:
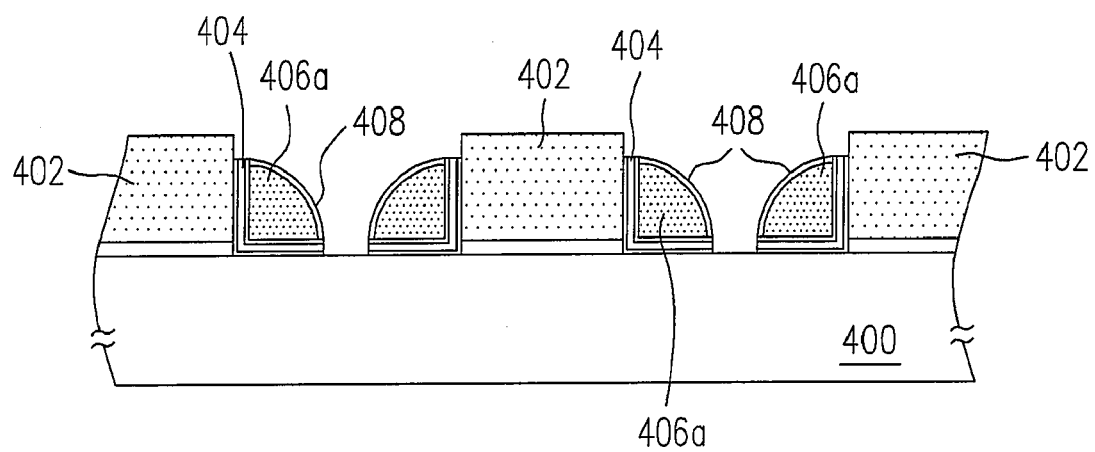

Next, with reference to FIG. 4D, the electron trapping layer 404 which is not covered by the conductive spacers 406a is removed. At this moment, if the protection layer 408 is a thermal oxide layer, portion of the thermal oxide layer will also be removed. However, portion of the protection layer 408 will still remain on the surface of the conductive spacers 406a.

Figure 4E:
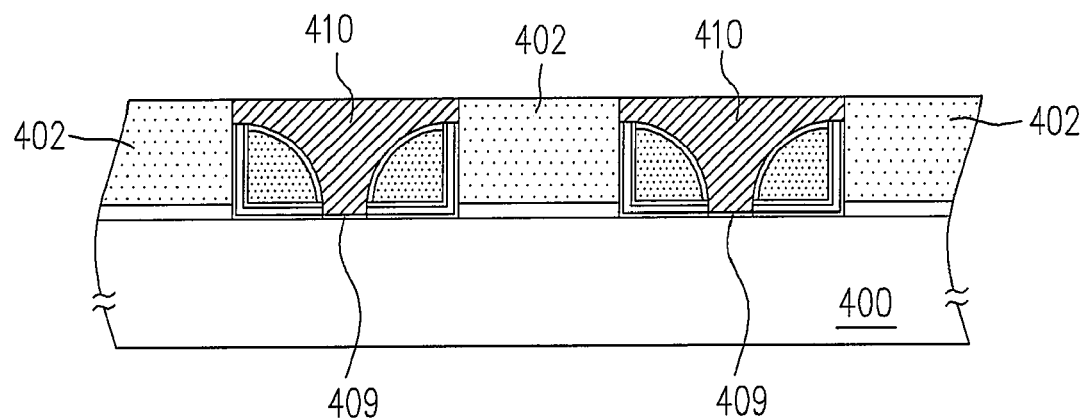

Next, with reference to FIG. 4E, a conductive layer 410 is formed between the dummy bit lines 402; and its manufacturing process for example is to grow a gate oxide layer 409 on the substrate 400 first, then deposit another poly-silicon layer to cover the dummy bit lines 402, and then planarize the poly-silicon layer with chemical mechanical polish (CMP) to expose the top of the dummy bit lines 402.

Figure 4F:
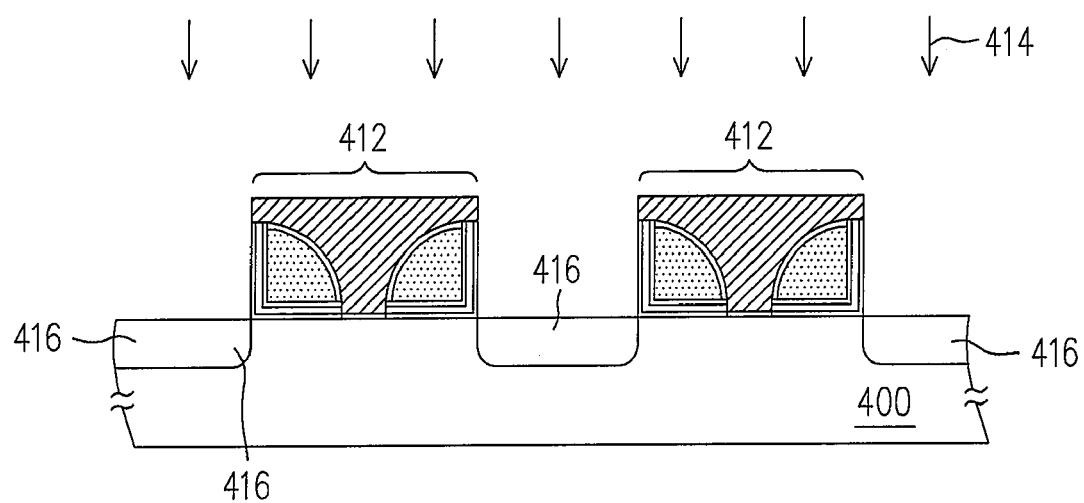

Next, with reference to FIG. 4F, remove the dummy bit lines 402 with hot phosphonic acid to form a plurality of strip structures 412. After this, the strip structures 412 can be selected as a mask to perform an LDD ion implantation process 414 upon the substrate 400, so that an LDD area 416 is formed in the substrate 400.

Figure 4G:
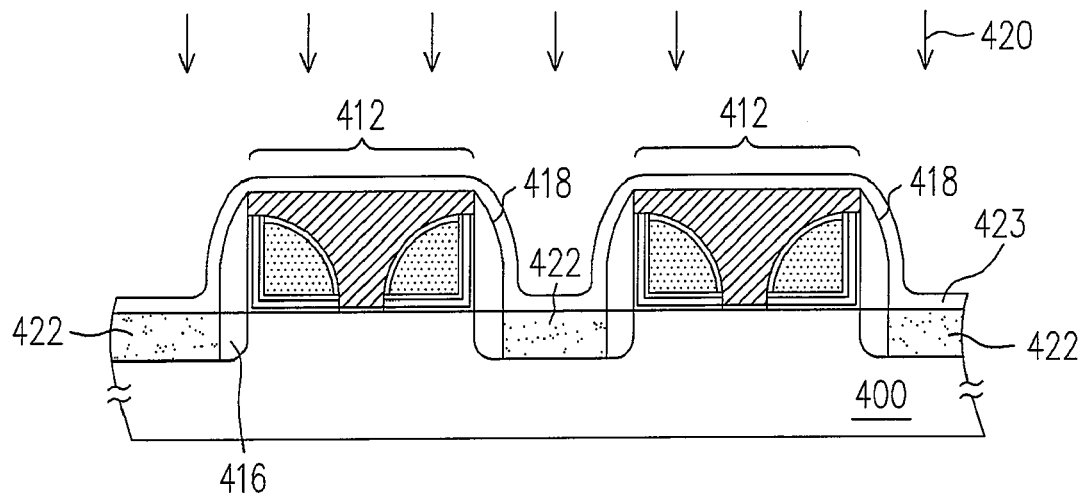

Next, with reference to FIG. 4G, if an LDD area 416 is formed, it can be selected to further form spacers 418 on the sidewalls of the strip structures 412, and use the spacers 418 as a mask for BL ion implantation process 420. Next, perform a BL ion implantation process 420 upon the substrate 400 to form the buried bit lines 422 in the substrate 400. Afterwards, a step of forming a dielectric layer for covering can be performed, for example, a thin silicon nitride layer is deposited first as a polishing stop layer.

Figure 4H:
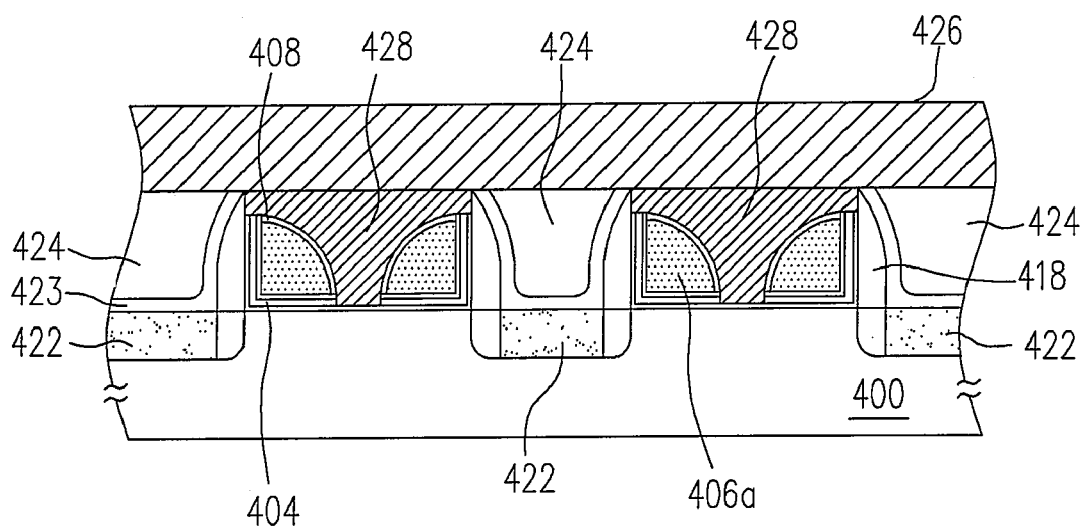

Further next, with reference to FIG. 4H, an oxide dielectric layer 424 is deposited on the substrate 400. Then, the oxide dielectric layer 424 is planarized using a chemical mechanical polish and stop on the thin silicon nitride layer 423. Then, the silicon nitride layer 423 is etched to expose the top of the strip structure 412. After that, a plurality of word lines 426 interlacing with the buried bit line 422 are formed over substrate 400. For example, a poly-silicon layer is deposited on substrate 400 to cover these strip structures 412, and then the poly-silicon layer is patterned. Next, the conductive layer (i.e. 410 in FIG. 4E) in the strip structures 412 is etched by using the word lines 426 as a mask so as to form a plurality of word gates 428.

Figure 5:
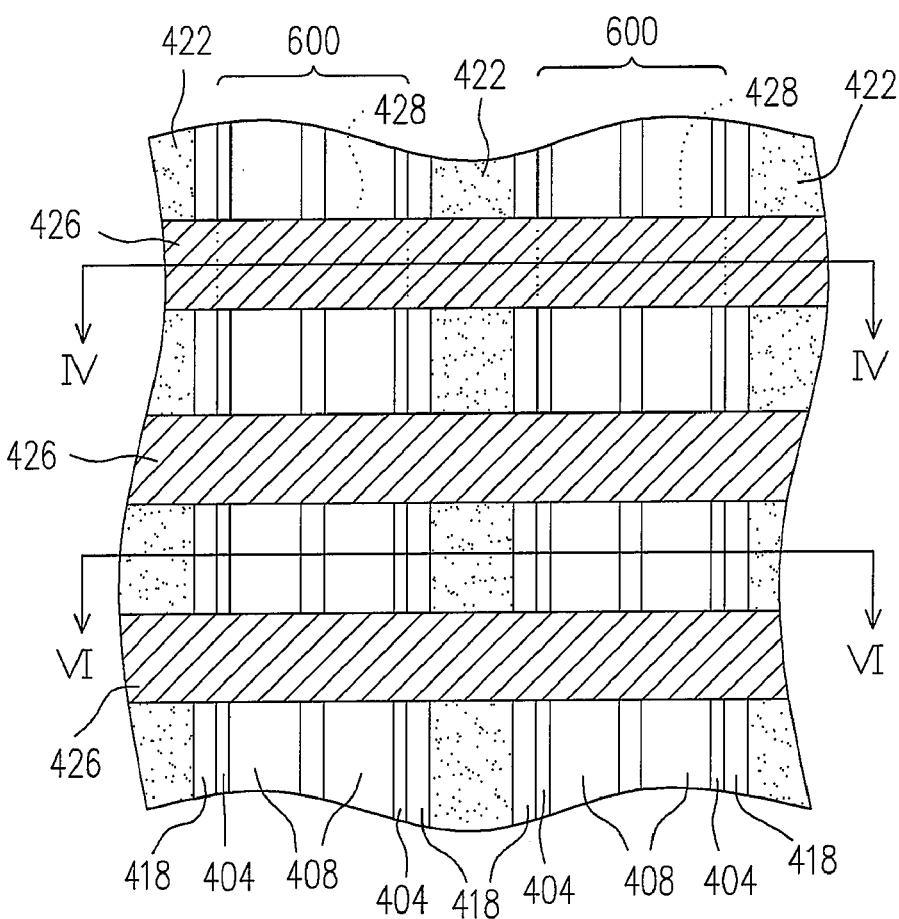
FIG. 5 illustrates a top view of the non-volatile memory according to the embodiment of the present invention.
Figure 6:
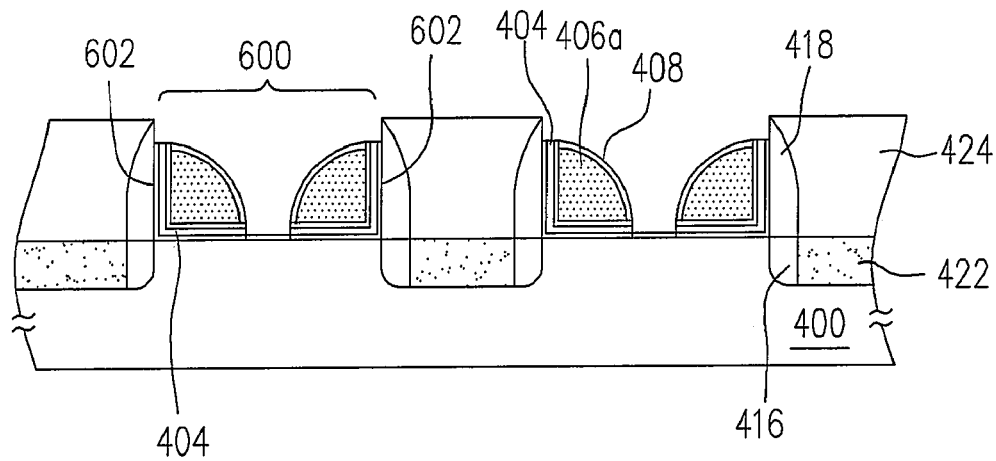
FIG. 6 illustrates a sectional view along the VI-VI line section in FIG. 5.

To detail the structural features and advantages of the embodiment of the present invention, please refer to FIG. 5 and FIG. 6. FIG. 5 is a top view of the non-volatile memory according to the embodiment of the present invention while FIG. 6 is a sectional view along the VI-VI line section in the FIG. 5. In addition, to simplify the description, please refer to FIG. 4H which is a sectional view along the IV-IV line section in FIG. 5.

With reference to FIG. 4H, FIG. 5 and FIG. 6, the ultimate structure formed according to the present embodiment mainly comprises the substrate 400, the dielectric layer 424, word lines 426, word gates 428, conductive spacers 406a, the electron trapping layer 404, the insulating layer (i.e. the protection layer 408) and buried bit lines 422. Wherein, the dielectric layer 424 is on the substrate 400 and comprises a plurality of trenches 600 constituted by poly-silicon thereon, and the word lines 426 are on the substrate 400 and disposed across the poly-silicon trenches 600. The word gates 428 are in the poly-silicon trenches 600 between the word lines 426 and the substrate 400, and the conductive spacers 406a are between the inner wall 602 of the poly-silicon trenches 600 and the word gates 428. Moreover, the electron trapping layer 404 is between the conductive spacers 406a and the inner wall 602 of poly-silicon trenches 600 and between the conductive spacers 406a and the substrate 400, the insulating layer 408 is between the conductive spacers 406a and the word gates 428, the buried bit lines 422 are in the substrate 400 between the poly-silicon trenches 600.

In summary, since the conductive spacers 406a of the present invention are formed earlier, therefore when forming the word gates 428 (as shown in FIG. 4H), the profiles between the substrate 400 and conductive spacers 406a will help to completely remove the conductive layer between the word lines 426 (as shown in FIG. 6). As a result, the word lines will not be connected in-between, thus the reliability of the whole memory will be improved.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A manufacturing method of a non-volatile memory, comprising:
    providing a substrate;
    forming a plurality of dummy bit lines on the substrate;
    forming an electron trapping layer covering the substrate and the dummy bit lines;
    forming a plurality of conductive spacers on the sidewalls of the dummy bit lines;

forming a protection layer on the surface of the conductive spacers;

removing the electron trapping layer which is not covered by the conductive spacers;

forming a plurality of conductive layers between the dummy bit lines;

removing the dummy bit lines to form a plurality of strip structures;

performing a BL ion implantation process upon the substrate, so as to form a plurality of buried bit lines in the substrate;

covering a dielectric layer on the buried bit lines and exposing the top of the strip structures;

forming a plurality of word lines over the substrate, and the word lines are interlaced with the buried bit lines; and etching the conductive layer in the strip structures by using the word lines as a mask to form a plurality of word gates.

2. The manufacturing method of the non-volatile memory of claim 1, wherein the step of forming the protection layer on the surface of the conductive spacers comprises using thermal oxidation method to form a thermal oxide layer on the surface of the conductive spacers.

3. The manufacturing method of the non-volatile memory of claim 2, wherein keeping a portion of the thermal oxide layer on the surface of the conductive spacers when removing the electron trapping layer.

4. The manufacturing method of non-volatile memory of claim 1, wherein before forming the buried bit lines in the substrate, further comprises:

performing an LDD ion implantation process upon the substrate by using the strip structures as a mask to form a plurality of LDD areas in the substrate; and forming a plurality of spacers on the sidewalls of the strip structures to serve as a mask of the BL ion implantation process.

5. The manufacturing method of the non-volatile memory of claim 1, wherein the step of forming the dummy bit lines on the substrate comprising:

growing a thin oxide layer on the substrate;

depositing a silicon nitride layer on the thin oxide layer; and patterning the silicon nitride layer.

6. The manufacturing method of the non-volatile memory of claim 1, wherein the step of forming the conductive spacers on the sidewalls of the dummy bit lines comprising:

depositing a first poly-silicon layer on the substrate to cover the dummy bit lines; and etching back the first poly-silicon layer to expose the electron trapping layer on top of the dummy bit lines.

7. The manufacturing method of the non-volatile memory of claim 1, wherein the step of forming a plurality of conductive layers between the dummy bit lines comprising:

depositing a second poly-silicon layer on the substrate to cover the dummy bit lines; and planarizing the second poly-silicon layer with chemical mechanical polish to expose the top of the dummy bit lines.

8. The manufacturing method of the non-volatile memory of claim 1, wherein the step of forming the word lines interlacing with buried bit lines over the substrate comprising:

depositing a third poly-silicon layer over the substrate to cover the strip structures; and patterning the third poly-silicon layer.

9. The manufacturing method of the non-volatile memory of claim 1, wherein the step of covering the dielectric layer on the buried bit lines comprising:

depositing a thin silicon nitride layer to serve as the polishing stop layer;

depositing an oxide dielectric layer on the substrate;

planarizing the oxidation dielectric layer with chemical mechanical polish and stopping on the thin silicon nitride layer; and etching the silicon nitride layer to expose the top of the strip structures.

10. The manufacturing method of the non-volatile memory of claim 1, wherein the method of removing the dummy bit lines comprises using hot phosphoric acid.

* * * * *